United States Patent [19]

Kita et al.

[11] 4,239,850
[45] Dec. 16, 1980

[54] PHOTOPOLYMERIZABLE COMPOSITION

[75] Inventors: Nobuyuki Kita; Toshio Uchida, both of Shizuoka; Sadaharu Ikeda, Asaka; Shigeru Sato, Minami-ashigara, all of Japan

[73] Assignee: Fuji Photo Film Co., Ltd., Minami-ashigara, Japan

[21] Appl. No.: 962,850

[22] Filed: Nov. 22, 1978

[30] Foreign Application Priority Data

Nov. 29, 1977 [JP] Japan .................... 52-142272

[51] Int. Cl.³ ............................................ G03C 1/68
[52] U.S. Cl. .................................. 430/281; 204/159.18; 204/159.23; 430/283; 430/284; 430/285; 430/919
[58] Field of Search ............ 96/115 P; 430/181, 185, 430/284, 285, 919; 204/159.18, 159.23

[56] References Cited

U.S. PATENT DOCUMENTS

| | | | |
|---|---|---|---|
| 3,870,524 | 3/1975 | Watanabe et al. | 96/115 P |
| 3,954,475 | 5/1976 | Bonham et al. | 96/115 P |
| 3,961,961 | 6/1976 | Rich | 96/115 P |
| 4,058,398 | 11/1977 | Ogada et al. | 96/115 P |
| 4,058,443 | 11/1977 | Murata et al. | 96/115 P |

OTHER PUBLICATIONS

Wakabayshi, et al., Bull. Soc. Japan, 42, 2924 (1969).
Schaefer et al., J. Org. Chem., 29, 1527 (1964).

*Primary Examiner*—Jack P. Brammer
*Attorney, Agent, or Firm*—Sughrue, Rothwell, Mion, Zinn and Macpeak

[57] ABSTRACT

A photopolymerizable composition comprising a polymerizable ethylenically unsaturated compound, optionally, a linear organic polymer, and a photopolymerization initiator comprising a combination of a compound represented by the general formula (I)

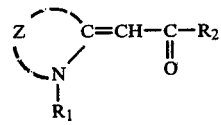

wherein Z represents the non-metal atomic group necessary to form a nitrogen containing heterocyclic nucleus, $R_1$ represents an alkyl group or a substituted alkyl group, and $R_2$ represents an alkyl group or an aryl group having a comparatively high photopolymerization initiating ability; and a compound represented by the general formula (II)

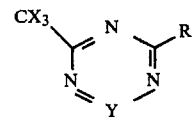

wherein X represents a halogen atom, Y represents $-CX_3$, $-NH_2$, $-NHR^1$, $-NR^1_2$ or $OR^1$, $R^1$ represents an alkyl group or an aryl group and R represents an alkyl group, an alkyl group substituted with at least one chlorine atom, an aryl group, a substituted aryl group or a substituted alkenyl group.

14 Claims, No Drawings

PHOTOPOLYMERIZABLE COMPOSITION

BACKGROUND OF THE INVENTION

1. Field of the Invention

The present invention relates to a photopolymerizable composition comprising an unsaturated monomer, a photopolymerization initiator and, if desired, a linear organic polymer. More particularly it relates to a photopolymerizable composition which is capable of providing photo-hardened images useful for production of printing plates or photoresists, etc.

2. Description of the Prior Art

It is well known that image duplication is carried out by a photographic method using photosensitive compositions comprising a polymerizable ethylenically unsaturated compound, a photopolymerization initiator and, if desired, a suitable linear organic polymer having film-forming ability, a thermal polymerization inhibitor, etc. As described in Japanese Patent Publications 5093/60 and 8495/60, since photopolymerization is induced by the application of actinic radiation by which the composition is rendered insoluble, it is possible to form photopolymerization images by providing suitable film of the photosensitive composition on a support and applying actinic radiation through a negative original of the desired image and removing the unexposed portions with a suitable solvent (hereinafter, development). It goes without saying that this type of photosensitive composition is very useful as a photosensitive material for preparing printing plates and photo-resists.

Hitherto, typical photopolymerization initiators for polymerizable ethylenically unsaturated compounds have been, benzyl, benzoin, benzoin ethyl ether, Michler's ketone, anthraquinone, acridine, phenazine, benzophenone and 2-ethylanthraquinone, etc. However, these initiators do not always have sufficient photopolymerization initiating ability for practical use because of actinic radiation they require for activation are comparatively short wavelengths and a long time may be required for image formation. Further, U.S. Pat. No. 3,870,524 recognizes that compounds represented by the general formula (I)

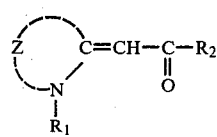

wherein Z represents the non-metal atomic group necessary to form a nitrogen containing heterocyclic nucleus, $R_1$ represents an alkyl group or a substituted alkyl group, and $R_2$ represents an alkyl group or an aryl group having a comparatively high photopolymerization initiating ability. However, their hardening rate is not adequate for image formation by light exposure. Further, while it has been found that a combination of the above compounds represented by the formula (I) and an aromatic sulfonyl halide compound has very high ability to initiate photopolymerization, the combination has poor storage stability, i.e., stability to lapse of time.

SUMMARY OF THE INVENTION

As the result of active study, a combination of photopolymerization initiators having excellent stability over time and very high photopolymerization initiating ability has been found.

A primary object of the present invention is to provide photopolymerization composition having excellent stability to time and high sensitivity.

This object is attained by providing a photopolymerizable composition comprising a polymerizable ethylenically unsaturated compound, optionally, a linear organic polymer, and a photopolymerization initiator comprising a combination of a compound represented by the above described general formula (I) and a compound represented by the general formula (II)

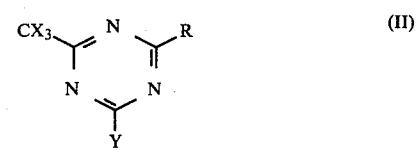

wherein X represents a halogen atom, Y represents $-CX_3$, $-NH_2$, $-NHR'$ $-NR'_2$ or $-OR'$, $R'$ represents an alkyl group or an aryl group and R represents an alkyl group, an alkyl group substituted with at least one chlorine atom, an aryl group, a substituted aryl group or a substituted alkenyl group.

DETAILED DESCRIPTION OF AN EMBODIMENT

As the polymerizable ethylenically unsaturated compounds used in the present invention, there are compounds well known to those familiar with this technology having at least two polymerizable ethylenically unsaturated groups in the molecule. Examples of such compounds include acrylic and methacrylic acid esters of polyols such as diethylene glycol diacrylate or dimethacrylate, triethylene glycol diacrylate or dimethacrylate, trimethylolpropane triacrylate or trimethacrylate or pentaerythritol triacrylate, etc. and bisacrylamides such as methylene bisacrylamide or xylene bisacrylamide, etc., described in Japanese Patent Publications 5093/60 and 14719/60 and British Pat. No. 1,154,872, and vinyl urethane compounds having two or more polymerizable vinyl groups in the molecule which are prepared by adding hydroxyl group-containing vinyl monomers represented by the following general formula (III) to polyisocyanate compounds having two or more isocyanate groups, described in Japanese Patent Publication 41708/73.

$$CH_2=C(R_3)COOCH_2CH(R_4)OH \qquad (III)$$

wherein $R_3$ and $R_4$ each represent H or $CH_3$.

Other useful compounds having two or more polymerizable ethylenically unsaturated groups in the molecule, are polyester polyacrylates (or polymethacrylates) and epoxy acrylates (or methacrylates) described in U.S. Pat. No. 3,732,107 and Japanese Patent Applications Nos. (OPI) 32003/73 and 30504/73. The ethylenically unsaturated group may be present in the composition in an amount of 10 to 80 wt.% preferably 25 to 75 wt.% based on the total weight of the composition.

The photopolymerization initiators represented by the general formula (I) used in the present invention,

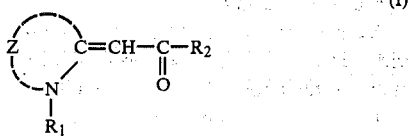

are compounds in which $R_1$ is an alkyl group (for example, a methyl group, an ethyl group or a propyl group, etc.) or a substituted alkyl group (for example, a 2-hydroxyethyl group, a 2-methoxyethyl group, a carboxymethyl group, a 2-carboxyethyl group, a 3-carboxypropyl group, a 2-sulfoethyl group, a 3-sulfopropyl group, a 2-carbomethoxyethyl group, a benzyl group, a phenethyl group, a p-sulfophenethyl group, a p-carboxyphenethyl group or a vinylmethyl group, etc.), $R_2$ is an alkyl group (for example, a methyl group, an ethyl group or a propyl group, etc.) or a monocyclic or bicyclic substituted or unsubstituted aryl group (for example, a phenyl group, a p-hydroxyphenyl group, a p-methoxyphenyl group, a p-chlorophenyl group, a naphthyl group or a thienyl group, etc.) and Z is a non-metal atomic group necessary to form a nitrogen containing heterocyclic nucleus used in conventional cyanine dyes, for example, benzothiazoles (e.g., benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole or 5,6-dimethoxybenzothiazole, etc.), naphthothiazoles (e.g., α-naphthothiazole or β-naphthothiazole, etc.) benzoselenazoles (e.g., benzoselenazole, 5-chlorobenzoselenazole, 6-methylbenzoselenazole or 6-methoxybenzoselenazole, etc.), naphthoselenazoles (e.g., α-naphthoselenazole or β-naphthoselenazole, etc.), benzoxazoles (e.g., benzoxazole, 5-methylbenzoxazole, 5-phenylbenzoxazole or 6-methoxybenzoxazole, etc.) and naphthoxazoles (e.g., α-naphthoxazole or β-naphthoxazole, etc.).

Representative examples represented by the general formula (I) include 2-benzoylmethylene-3-methyl-β-naphthothiazoline, 2-benzoylmethylene-3-ethyl-β-naphthothiazoline, 3-ethyl-2-(thenoyl)methylene-β-naphthothiazoline, 3-ethyl-2-propionylmethylene-β-naphthothiazoline, 5-chloro-3-ethyl-2-p-methoxybenzoylmethylene-benzothiazoline, 2-benzoylmethylene-3-ethylbenzoselenazoline, 2-benzoyl-3-(2-methoxyethyl)-benzoselenazoline, 2-benzoyl-3-ethyl-α-naphthothiazoline and 2-benzoyl-3-(2-methoxyethyl)benzothiazoline, etc.

The photopolymerization initiators represented by the general formula II used in the present invention,

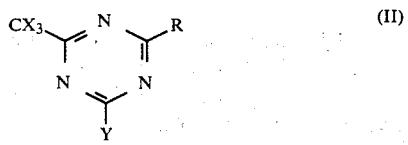

are compounds in which X is a halogen atom (e.g., chlorine or bromine). R may be an alkyl group, an alkyl group substituted with a chlorine atom, an aryl group, a substituted aryl group or a substituted alkenyl group. Suitable alkyl groups contain 1 to 10 carbon atoms and may be straight chain or branched chain (e.g., a methyl group, an ethyl group, a propyl group, an isopropyl group, a butyl group, a t-butyl group, a hexyl group, a nonyl group or a decyl group). Suitable alkyl groups substituted with at least one chlorine atom contain 1 to 10 carbon atoms and may be straight chain or branched chain as in the case of R being alkyl.

Suitable aryl groups for R may be monocyclic or bicyclic such as a phenyl group or a naphthyl group. The aryl groups may be substituted or unsubstituted. Suitable substituents are an alkyl group having 1 to 4 carbon atoms (e.g., a methyl group, an ethyl group, a propyl group, or a butyl group), an alkoxy group having 1 to 4 carbon atoms (e.g., a methoxy group, an ethoxy group, a propoxy group, or a butoxy group), a halogen atom, (e.g., chlorine, bromine, fluorine) and a methylene dioxy group.

The substituted alkenyl group for R may be represented by the formula $-(CH=CH)_n W$ wherein n is 1 to 3 and W represents an aromatic nucleus (e.g., phenyl, naphthyl) or a heterocyclic nucleus (e.g., a heterocyclic nucleus for a cyanine dye, (such as benzoxazole, benzothiazole, etc.) which nuclei may be substituted with a halogen atom (e.g., chlorine or bromine), a phenyl group, an alkyl group having 1 to 6 carbon atoms, a nitro group, an alkoxy group having 1 to 6 carbon atoms, an acetoxy group, an acetyl group, an alkylamino group having 1 to 6 carbon atoms.

Y represents $-CX_3$, $-NH_2$, $-NHR'$, $-NR_2'$ or $-OR'$ wherein R' represents an alkyl group having 1 to 4 carbon atoms (e.g., a methyl group, an ethyl group, a propyl group, a butyl group or a tert-butyl group) or an aryl group which may be monocyclic or bicyclic such as a phenyl group or a naphthyl group.

As the compounds represented by the general formula (II) used in the present invention, there are compounds described in Bull. Chem. Soc. Japan, 42 2924 (1969) written by Wakabayashi et al, examples of which include 2-phenyl-4,6-bis-(trichloromethyl)-s-triazine, 2-(p-chlorophenyl)-4,6-bis-(trichloromethyl)-s-triazine, 2-(p-tolyl)-4,6-bis-(trichloromethyl)-s-triazine, 2-(p-methoxyphenyl)-4,6-bis-(trichloromethyl)-s-triazine, 2-(2',4'-dichlorophenyl)-4,6-bis-(trichloromethyl)-s-triazine, 2,4,6-tris-(trichloromethyl)-s-triazine, 2-methyl-4,6-bis-(trichloromethyl)-s-triazine, 2-n-nonyl-4,6-bis-(trichloromethyl)-s-triazine and 2-(α,α,β-trichloroethyl)-4,6-bis-(trichloromethyl)-s-triazine, etc. Further, there are compounds described in British Pat. No. 1,388,492, examples of which include 2-styryl-4,6-bis-(trichloromethyl)-s-triazine, 2-(p-methylstyryl)-4,6-bis-(trichloromethyl)-s-triazine, 2-(p-methoxystyryl)-4,6-bis-(trichloromethyl)-s-triazine and 2-(p-methoxystyryl)-4-amino-6-trichloromethyl-s-triazine, etc. Further, there are compounds described in J. Org. Chem. 29 1527 (1964) by F. C. Schaefer et al, examples of which include 2-methyl-4,6-bis-(tribromomethyl)-s-triazine, 2,4,6-tris-(tribromomethyl)-s-triazine, 2-methyl-4-amino-6-tribromomethyl-s-triazine and 2-methyl-4-methoxy-6-trichloromethyl-s-triazine, etc.

In the general formula (II), compounds wherein Y is $-CX_3$ are particularly preferred.

The amount of the photopolymerization initiators used in a photopolymerizable composition is generally very small. If it is unsuitably large, undesirable effects such as interception of effective rays, etc. result. A sufficient amount of the photopolymerization initiators of the present invention is such that the sum total of the amounts. compounds represented by the general formula (I) and the general formula (II) is about 0.01%–20% by weight based on the total weight of the polymerizable ethylenically unsaturated compound and, if present, the linear organic polymer. A particularly good result is obtained in an amount of about 1%–10% by weight. Further, it is preferred that the ratio of the amount of compounds represented by the formula (I) and formula (II) to the total amount of photosensitive initiators I and photoinitiator II is 80–20% by weight and 20–80% by weight, respectively.

In the present invention, the linear organic polymer must, of course, be compatible with the polymerizable ethylenically unsaturated compound. Although any linear organic polymer may be used as long as it is compatible with the polymerizable ethylenically unsaturated compound, it is preferred to select a linear organic polymer developable with water or with a weak alkaline aqueous solution. Linear organic polymers of this type are well known to those skilled in the art and are frequently employed in photopolymerizable compositions. The linear organic polymer is used not only as a film forming agent in said composition but also as a material developable with a developer composed of water, a weak alkaline aqueous solution or an organic solvent. For example, if a water soluble organic polymer is used, it becomes possible to carry out development with water. As such organic polymers, there are addition polymers having carboxyl groups in the side chain such as methacrylic acid copolymers, acrylic acid copolymers, itaconic acid copolymers, crotonic acid copolymers, maleic acid copolymers or partially esterified maleic acid copolymers, acid cellulose derivatives having carboxyl groups in the side chain and addition polymers having hydroxy groups with a cyclic acid anhydride. In addition, useful water soluble linear organic polymers are polyvinyl pyrrolidone and polyethylene oxide. Further, in order to increase strength of hardened films, alcohol-soluble polyamide and polyether of 2,2-bis-(4-hydroxyphenyl)propane and epichlorohydrin are useful. Although these linear organic polymers may be added to the composition in any suitable amount, an amount of more than 90% by weight based on the total weight of the composition is not preferred from the viewpoint of image strength, etc. Based on the weight of the ethylenically unsaturated monomer the linear organic polymer may be present in an amount of 20 to about 900 wt.%, preferably 50 to 300 wt.%.

Further, in the present invention, it is preferred to add a small amount (generally 0.001 to 5 wt.% based on the weight of the ethylenically unsaturated monomer) of a thermal polymerization inhibitor in order to prevent unnecessary thermal polymerization of polymerizable ethylenically unsaturated compounds during production or preservation and storage of the sensitive composition. Preferred thermal polymerization inhibitors, are hydroquinone, p-methoxyphenyl, di-t-butyl-p-cresol, pyrogallol, t-butylcatechol, benzoquinone, 4,4'-thiobis-(3-methyl-6-t-butylphenol), 2,2'-methylenebis-(4-methyl-6-t-butylphenol), 2-mercaptobenzoimidazole and N-nitrosophenylhydroxylamine cerium (III) salt, etc. If necessary, dyes or pigments may be added in order to color and inorganic fillers may be added in order to improve properties of hardened films.

The compositions of this invention are exposed to light of wavelength in the 3000–5000 Å range. Suitable sources of such light include carbon arcs, mercury-vapor arcs, metal halide lamps, fluorescent lamps with ultraviolet radiation-emitting phosphors, xenon lamps and sun light.

The invention will be further illustrated by reference to the following examples, but the invention is not to be construed as being limited thereto. Unless otherwise indicated all parts, percents, ratios, etc. are by weight.

EXAMPLE 1

Onto an aluminum plate which had been treated with an aqueous solution of sodium silicate after being grained with a nylon brush, the following photosensitive solution was applied using a wheeler and dried at 100° C. for 2 minutes. The application after drying was about 2.0 g/m$^2$.

| | |
|---|---|
| Hydroxypropylmethyl acetylcellulose hexahydrophthalate (substitution degree: hydroxypropyl group: methyl group: acetyl group 0.18:1.35:1.43; modification degree: hexahydrophthalyl group 0.85; viscosity 93.2 cps (solvent mixture of acetone/methanol 7/3 at 20° C.)) | 0.6 g |
| Di-(2'-acryloxyethyl)-2,4-tolylenediurethane | 1.4 g |
| 4,4'-Thiobis-(3-methyl-6-t-butylphenol) | 0.002 g |
| Photopolymerization initiator | Table 1 |
| Ethylene glycol monomethyl ether | 18 g |

Exposure was conducted with PS light (type S) manufactured by Fuju Photo Film Co., Ltd. (Metal halide lamp 2 KW) at one meter distance using a vacuum printing apparatus. The sensitivity was measured using a grey scale of 21 steps having the transmission density of 0.10 at the 1st step and the density difference of 0.15. Development was carried out by dipping the plate in a developing solution composed of 10 g of triethanolamine, 30 g of butyl cellosolve and 950 g of water at 25° C. for 1 minute.

The results obtained upon measuring sensitivity and stability to time are shown in Table 1 wherein the combinations of photopolymerization initiator is varied as shown.

TABLE 1

Combination of Photopolymerization Initiator, Sensitivity and Stability to Time

| Experiment No. | Photopolymerization Initiator | Amount (g) | Optimum exposure time (sec) | Stability (45° C. and 75% humidity) |
|---|---|---|---|---|
| 1 | (structure: naphtho-thiazoline with N-CH$_3$, =CH-C(=O)-phenyl) | | 0.04 | Properties had not deteriorated in 5 days |

TABLE 1-continued

Combination of Photopolymerization Initiator,
Sensitivity and Stability to Time

| Experiment No. | Photopolymerization Initiator | Amount (g) | Optimum exposure time (sec) | Stability (45° C. and 75% humidity) |
|---|---|---|---|---|
| | [structure: triazine with CCl$_3$ groups and p-methoxyphenyl] | 0.04 | 2 | |
| 2 | [structure: naphthothiazoline with CH=C(O)-phenyl, N-CH$_3$] | 0.04 | | Same as in Experiment 1 |
| | [structure: triazine with CCl$_3$ groups and p-tolyl] | 0.04 | 2 | |
| 3 | [structure: naphthothiazoline with CH=C(O)-phenyl, N-CH$_3$] | 0.04 | | Same as in No. 1 |
| | [structure: triazine with CCl$_3$ groups and CH=CH-phenyl-OCH$_3$] | 0.04 | 3 | |
| Comparison 1. | [structure: naphthothiazoline with CH=C(O)-phenyl, N-CH$_3$] | 0.04 | 30 | Same as in No. 1 |
| Comparison 2. | " | 0.08 | 30 | Same as in No. 1 |
| Comparison 3. | [structure: triazine with CCl$_3$ groups and p-methoxyphenyl] | 0.04 | 210 | Same as in No. 1 |
| Comparison 4. | [structure: triazine with CCl$_3$ groups and CH=CH-phenyl-OCH$_3$] | 0.04 | 40 | Same as in No. 1 |
| Comparison 5. | [structure: naphthothiazoline with CH=C(O)-phenyl, N-CH$_3$] | 0.04 | | Properties deteriorated after 1 day |
| | [structure: naphthalene-SO$_2$Cl] | 0.04 | 4 | |

From the above results it is understood that the sensitivity increases remarkably when using the combination of the present invention in comparison to using only one of the photopolymerization initiators. Further, it is clear from Comparison 5 that the photopolymerization initiators of the present invention are more stable over time.

Thus, the photopolymerization initiators comprising a combination of a compound represented by the general formula (I) and a compound represented by the general formula (II) have very high sensitivity and are stable to time.

EXAMPLE 2

Photosensitive plates were produced in the same manner as in Example 1 using the following composition in a coating amount of 2.0 g/m².

| | | |
|---|---|---|
| Methyl methacrylate/methacrylic acid copolymer (molar ratio: 85/15) (limiting viscosity in methyl ethyl ketone (MEK) at 30° C.:0.166) | 48 | g |
| Trimethylolpropane triacrylate | 29 | g |
| Compound represented by the general formula (I) | 1.9 | g |
| Compound represented by the general formula (II) | 2.7 | g |
| Triphenyl phosphate | 8 | g |
| Ethyl cellosolve | 50 | ml |
| Methylene chloride | 27 | ml |

After the resulting photosensitive plates were exposed to light for 2 minutes through a step wedge having 0.15 of density difference using a plano PS Printer A3 (produced by Fuji Photo Film Co., Ltd.), the unexposed portions were removed using the developing solution having the following composition.

Developing solution:

| | | |
|---|---|---|
| Trisodium phosphate | 25 | g |
| Monosodium phosphate | 5 | g |
| Butyl cellosolve | 70 | g |
| Activating agent | 2 | ml |
| Water | 1 | liter |

The compounds represented by the general formulas (I) and (II) are shown in Table 2 and Table 3. Sensitivity in the case of using the compound represented by the general formula (I) or the compound represented by the general formula (II) alone and in case of using a combination of both of them are shown in Table 4. The sensitivity is a relative sensitivity using the sensitivity of the case of using Compound I—1 alone as 1.

TABLE 2

Compounds represented by general formula (I)

| Compound No. | Structural formula |
|---|---|
| I-1 | (naphtho-benzothiazoline with N-CH₃, =CH-C(=O)-phenyl) |
| I-2 | (naphtho-benzothiazoline with N-C₂H₅, =CH-C(=O)-phenyl) |
| I-3 | (naphtho-benzothiazoline with N-C₂H₅, =CH-C(=O)-thienyl) |

TABLE 2-continued

Compounds represented by general formula (I)

| Compound No. | Structural formula |
|---|---|
| I-4 | (5-chloro-benzothiazoline with N-C₂H₅, =CH-C(=O)-C₆H₄-OCH₃) |
| I-5 | (benzoselenazoline with N-C₂H₅, =CH-C(=O)-phenyl) |
| I-6 | (naphtho-benzothiazoline with N-C₂H₅, =CH-C(=O)-phenyl) |
| I-7 | (benzoselenazoline with N-CH₂CH₂OCH₃, =CH-C(=O)-phenyl) |
| I-8 | (naphtho-benzothiazoline with N-C₂H₅, =CH-C(=O)-C₂H₅) |

TABLE 3

Compounds represented by general formula (II)

| Compound No. | Structural formula |
|---|---|
| II-1 | triazine with CCl₃, CCl₃, CH₃ substituents |
| II-2 | triazine with CCl₃, CCl₃, C₉H₁₉ substituents |
| II-3 | triazine with CCl₃, CCl₃, CCl₃ substituents |
| II-4 | triazine with CCl₃, CCl₃, (4-Cl-phenyl) substituents |
| II-5 | triazine with CCl₃, CCl₃, phenyl substituents |

TABLE 3-continued

Compounds represented by general formula (II)

| Compound No. | Structural formula |
|---|---|
| II-6 | CCl$_3$ group with triazine ring bearing CCl$_3$ and C(=N-)-C$_6$H$_4$-OCH$_3$ |
| II-7 | CCl$_3$ group with triazine ring bearing CCl$_3$ and C(=N-)-benzodioxole |
| II-8 | CCl$_3$ group with triazine ring bearing CCl$_3$ and C(=N-)-CH=CH-C$_6$H$_4$-OCH$_3$ |
| II-9 | CBr$_3$ group with triazine ring bearing CBr$_3$ and CBr$_3$ |
| II-10 | CCl$_3$ group with triazine ring bearing NH$_2$ and C(=N-)-CH=CH-C$_6$H$_4$-OCH$_3$ |

TABLE 4

Relative Sensitivity and Stability

| Photosensitizer (I) | Photosensitizer (II) | Relative Sensitivity | Stability (at 45° C. and 75% of the humidity) |
|---|---|---|---|
| I-1 | | 1 | Properties did not deteriorate in 5 days |
| I-2 | | 2 | Properties did not deteriorate in 5 days |
| I-3 | | 0 | Properties did not deteriorate in 5 days |
| I-4 | | 0 | Properties did not deteriorate in 5 days |
| I-5 | | 0 | Properties did not deteriorate in 5 days |
| I-6 | | 0 | Properties did not deteriorate in 5 days |
| I-7 | | 0 | Properties did not deteriorate in 5 days |
| I-8 | | 0 | Properties did not deteriorate in 5 days |
| | II-1 | 0 | Properties did not deteriorate in 5 days |
| | II-2 | 0 | Properties did not deteriorate in 5 days |
| | II-3 | 0 | Properties did not deteriorate in 5 days |
| | II-4 | 0 | Properties did not deteriorate in 5 days |
| | II-5 | 0 | Properties did not deteriorate in 5 days |
| | II-6 | 0.7 | Properties did not deteriorate in 5 days |
| | II-7 | 1.4 | Properties did not deteriorate in 5 days |
| | II-8 | 4 | Properties did not deteriorate in 5 days |
| | II-9 | 0 | Properties did not deteriorate in 5 days |
| | II-10 | 2 | Properties did not deteriorate in 5 days |
| I-1 | II-1 | 22 | Properties did not deteriorate in 5 days |
| I-1 | II-2 | 11 | Properties did not deteriorate in 5 days |
| I-1 | II-3 | 32 | Properties do not deteriorate after 5 days |
| I-1 | II-4 | 16 | Properties do not deteriorate after 5 days |
| I-1 | II-5 | 16 | Properties do not deteriorate after 5 days |
| I-1 | II-6 | 16 | Properties do not deteriorate after 5 days |
| I-1 | II-7 | 22 | Properties do not deteriorate after 5 days |
| I-1 | II-8 | 16 | Properties do not deteriorate after 5 days |
| I-1 | II-9 | 16 | Properties do not deteriorate after 5 days |
| I-1 | II-10 | 16 | Properties do not deteriorate after 5 days |
| I-2 | II-3 | 32 | Properties do not deteriorate after 5 days |
| I-3 | II-3 | 22 | Properties do not deteriorate after 5 days |
| I-4 | II-3 | 16 | Properties do not deteriorate after 5 days |
| I-5 | II-3 | 16 | Properties do not deteriorate after 5 days |
| I-6 | II-3 | 16 | Properties do not deteriorate after 5 days |
| I-7 | II-3 | 8 | Properties do not deteriorate after 5 days |
| I-8 | II-3 | 6 | Properties do not deteriorate after 5 days |
| I-2 | II-6 | 16 | Properties do not deteriorate after 5 days |
| I-3 | II-6 | 16 | Properties do not deteriorate after 5 days |
| I-4 | II-6 | 16 | Properties do not deteriorate after 5 days |
| I-5 | II-6 | 16 | Properties do not deteriorate after 5 days |
| I-6 | II-6 | 6 | Properties do not deteriorate after 5 days |
| I-7 | II-6 | 8 | Properties do not deteriorate after 5 days |
| I-8 | II-6 | 6 | Properties do not deteriorate after 5 days |

It is clear from the results in Table 4, that the sensitivity increases remarkably when using the photopolymerization initiator comprising a combination of compounds represented by the general formula (I) and compound represented by the general formula (II) as compared to cases of using each of them alone.

EXAMPLE 3

To an aluminum plate which has been, in order, grained, subjected to anodic oxidation in a sulfuric acid solution and undercoated with a water soluble resin, described in Japanese Patent Application (OPI) 9501/77, the following photosensitive composition was applied.

| | |
|---|---|
| Chlorinated polyethylene (Trade name: Superchron CPE-907 LTA, produced by Sanyo Kokusaku Pulp Co. | 6.67 g |

-continued

| | |
|---|---|
| Pentaerythritol trimethacrylate | 10 g |
| Hydroquinone | 0.01 g |
| Copper phthalocyanine pigment | 0.21 g |
| 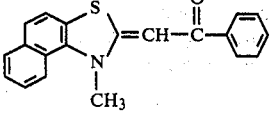 | 0.3 g |
| 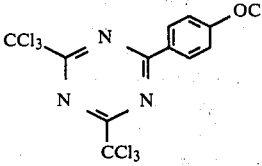 | 0.3 g |
| Methyl ethyl ketone | 100 ml |
| Dimethylformamide | 20 ml |

Drying was carried out at 120° C. for 2 minutes. An application amount after drying was about 4 g/m². To the resulting photosensitive layer on the aluminium plate, a polyethylene terephthalate film having 25 μm of the thickness was applied by pressing. After placing a negative having letters on the polyethylene terephthalate film, the laminate was exposed to light for 7 seconds as in Example 1. The polyethylene terephthalate film was then stripped off whereby photo-hardened positive images are obtained on the aluminum plate. When printing was carried out with using the resulting lithographic printing plate, beautiful prints which were not soiled could be obtained.

Further, after the above described photosensitive aluminum plate having a polyethylene terephthalate film 25 μm of the thickness applied under pressing was stored for 5 days at 45° C. and 75% of the humidity in the dark, stored it was exposed to light. After exposure and sripping development as above. When printing was carried out, beautiful prints which were not soiled were similarly obtained.

For purposes of comparison a plate was prepared using 3-methyl-2-benzoylmethylenenaphtho(1,2-d)thiazoline alone. The optimum exposing time for this plate was 45 seconds almost 7 times longer than in the case of using the combined sensitizers.

EXAMPLE 4

Onto a polyethylene terephthalate film having 100μ thickness on which an aluminum-iron alloy had been deposited by evaporation in a thickness of 600 Å, the following photosensitive solution was applied using a wheeler and dried at 100° C. for 2 minutes.

Photosensitive solution:

| | |
|---|---|
| Benzyl methacrylate/methacrylic acid copolymer (73/27 % by weight) (intrinsic viscosity in MEK at 30° C.: 0.12) | 3 g |
| Pentaerythritol tetraacrylate | 0.72 g |
| 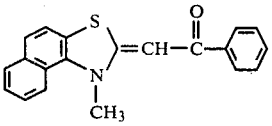 | 0.03 g |
| 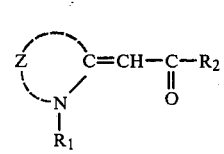 | 0.03 g |
| Behenic acid | 0.03 g |
| Hydroquinone monomethyl ether | 0.001 g |
| Methyl ethyl ketone | 12 g |
| Methyl cellosolve acetate | 8 g |

The application amount after drying was 2.5 g/m². This photosensitive film was exposed to light for 2 seconds through a negative having letters using the exposure apparatus used in Example 1. It was then processed by dipping in the following development-metal etching solution at 31° C. for 60 seconds to obtain a contact film having a metal relief image in the exposed portions and the unexposed portions were transparent.

| Development-metal etching solution | |
|---|---|
| Sodium hydroxide | 4 g |
| Sodium tertiary phosphate | 10 g |
| Sodium aluminate | 3 g |
| Potassium bromide | 5 g |
| Water | 1 liter |

For comparison a plate was similarly prepared using 3-methyl-2-benzoylmethylenenaphtho(1,2-d)-thiazoline alone as the photopolymerization initiator in the above described photosensitive solution, the optimum exposure time was 25 seconds about 12 times more than in the case of using the sensitizer combination of the present invention.

We claim:

1. In a photopolymerizable composition comprising a monomer having at lest two ethylenically unsaturated bonds which is capable of photopolymerization upon exposure to actinic radiation, a photopolymerization initiator and, optionally, a linear organic polymer, the improvement which comprises said photopolymerization initiator comprising a combination of at least one compound represented by the formula (I)

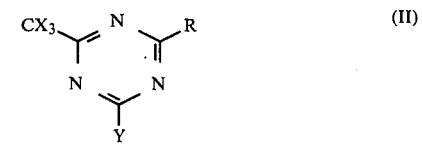

(I)

wherein Z represents the non-metal atoms necessary to form a nitrogen containing heterocyclic nucleus, $R_1$ represents an alkyl group or a substituted alkyl group, and $R_2$ represents an alkyl group or an aryl group, and at least one compound represented by the formula (II)

$$CX_3 \underset{N}{\overset{N}{\diagdown}} \underset{Y}{\overset{R}{\diagup}}$$ (II)

wherein X represents a halogen atom, Y represents —$CH_3$, —$NH_2$, —NHR', —$NR'_2$ or —OR' wherein R' represents an alkyl group or an aryl group, and R represents an alkyl group, a substituted alkyl group, an aryl group, a substituted aryl group or a substituted alkenyl group and wherein said photopolymerization initiator is present in an amount of 1 to 10% by weight based on the total weight of the polymerizable ethylenically unsaturated compound and the linear organic high molecular weight compounds and wherein the ratio of the compound represented by formula (I) to the compound represented by formula (II) of said photopolymerization initiator is 4:1 to 1:4.

2. The photopolymerizable composition of claim 1, wherein Y in Formula (II) represents —$CX_3$.

3. The composition of claim 1, wherein $R_1$ is selected from the group consisting of a methyl group, an ethyl group, a propyl group, a 2-hydroxyethyl group, a 2-methoxyethyl group, a carboxymethyl group, a 2-carboxyethyl group, a 3-carboxypropyl group, a 2-sulfoethyl group, a 3-sulfopropyl group, a 2-carboxymethoxyethyl group, a benzyl group, a phenethyl group, a p-sulfophenethyl group, a p-carboxyphenethyl group and a vinyl methyl group.

4. The photopolymerizable composition of claim 1, wherein $R_2$ is selected from the group consisting of a methyl group, an ethyl group, a propyl group, a phenyl group, a p-hydroxyphenyl group, a p-methoxyphenyl group, a p-chlorophenyl group, a naphthyl group or a thienyl group.

5. The composition of claim 3, wherein said heterocyclic nucleus formed by Z is a heterocyclic nucleus used in conventional cyanine dyes.

6. The composition of claim 1, wherein R is selected from the group consisting of a straight or branched chain alkyl group having 1 to 10 carbon atoms, a straight or branched chain alkyl group substituted with at least one chlorine atom having 1 to 10 carbon atoms, a monocyclic or bicyclic aryl group which may be substituted with an alkyl group, an alkoxy group, a halogen atom or a methylene dioxy group, and a substituted alkenyl group represented by the formula (-CH=CH)$_n$W, wherein n is 1 to 3 and W represents an aromatic nucleus or a heterocyclic nucleus which nuclei may be substituted with a halogen atom, a phenyl group, an alkyl group, a nitro group, an alkoxy group, an acetoxy group, an acetyl group, or an alkylamino group.

7. The photopolymerizable composition of claim 1, wherein said compound of the formula (I) is 2-benzoylmethylene-3-methyl-$\beta$-naphthothiazoline, 2-benzoylmethylene-3-ethyl-$\beta$-naphthothiazoline, 3-ethyl-2-(thenoyl)methylene-$\beta$-naphthothiazoline, 3-ethyl-2-propionylmethylene-$\beta$-naphthothiazoline, 5-chloro-3-ethyl-2-p-methoxybenzoylmethylenebenzothiazoline, 2-benzoylmethylene-3-ethylbenzoselenazoline, 2-benzoyl-3-(2-methoxyethyl)benzoselenazoline, 2-benzoyl-3-ethyl-$\alpha$-naphthothiazoline, or 2-benzoyl-3-(2-methoxyethyl)benzothiazoline.

8. The photopolymerizable composition of claim 1, wherein said composition additionally contains a thermopolymerization inhibitor.

9. The photopolymerizable composition of claim 2, wherein X represents chlorine atom or bromine atom.

10. The photopolymerization composition of claim 8, wherein said thermopolymerization inhibitor is present in an amount of 0.001 to 5% by weight based on the weight of the ethlenically unsaturated monomer.

11. The photopolymerizable composition of claim 1, wherein said compound of the formula (II) is 2-phenyl-4, 6-bis-(trichloromethyl)-s-triazine, 2-(p-chlorophenyl)-4, 6-bis-(trichloromethyl)-s-triazine, 2-(p-tolyl)-4, 6-bis-(trichloromethyl)-s-triazine, 2-(p-methoxyphenyl)-4, 6-bis-(trichloromethyl)-s-triazine, 2-(2',4'-dichlorophenyl)-4, 6-bis-(trichloromethyl)-s-triazine, 2,4,6-tris-(trichloromethyl)-s-triazine, 2-methyl-4,6-bis-(trichloromethyl)-s-triazine, 2-n-nonyl-4,6-bis-(trichloromethyl)-s-triazine, 2-($\alpha,\alpha,\beta$-trichloroethyl)-4,6-bis-(trichloromethyl)-s-triazine, 2-styryl-4,6-bis-(trichloromethyl)-s-triazine, 2-(p-methylstyrryl)-4,6-bis-(trichloromethyl)-s-triazine, 2-(p-methoxystyryl)-4,6-bis-(trichloromethyl)-s-triazine, 2-(p-methoxystyryl)-4-amino-6-trichloromethyl-s-triazine, 2-methyl-4-,6-bis-(tribromomethyl)-s-triazine, 2,4,6-tris-(tribromomethyl)-s-triazine, 2-methyl-4-amino-6-tribromomethyl-s-triazine or 2-methyl-4-methoxy-6-trichloromethyl-s-triazine.

12. The photopolymerizable composition of claim 7, wherein said compound of the formula (II) is 2-phenyl-4,6-bis-(trichloromethyl)-s-triazine, 2-(p-chlorophenyl)-4,6-bis-(trichloromethyl)-s-reiazine, 2-(p-tolyl)-4,6-bis-(trichloromethyl)-s-triazine, 2-(p-methoxyphenyl)-4,6-bis-(trichloromethyl)-s-triazine, 2-(2',4'-dichlorophenyl)-4,6-bis-(trichloromethyl)-s-triazine, 2,4,6-tris-(trichloromethyl)-s-triazine, 2-methyl-4,6-bis-(trichloromethyl)-s-triazine, 2-n-nonyl-4,6-bis-(trichloromethyl)-s-triazine, 2-($\alpha,\alpha,\beta$-trichloroethyl)-4,6-bis-(trichloromethyl)-s-triazine, 2-styryl-4,6-bis-(trichloromethyl)-s-triazine, 2-(p-methoxystyryl)-4,6-bis-(trichloromethyl)-s-triazine, 2-(p-methoxystyryl)-4-amino-6-trichloromethyl-s-triazine, 2-methyl-4,6-bis-(tribromomethyl)-s-triazine,2,4,6-tris-(tribromomethyl)-s-triazine, 2-methyl-4-amino-6-tribromomethyl-s-triazine, 2-(p-methylstyrl)-4,6-bis-(trichloromethyl)-s-triazine or 2-methyl-4-methoxy-6-trichloromethyl-s-triazine.

13. The photopolymerizable composition of claim 1, wherein said monomer is present in an amount of 10 to 80% by weight based on the total weight of the composition.

14. The photopolymerizable composition of claim 1 wherein the linear organic polymer is present in an amount of about 20 to 900 weight % based on the ethylenically unsaturated monomer.

* * * * *